United States Patent [19]
Mullett

[11] Patent Number: 5,475,346
[45] Date of Patent: Dec. 12, 1995

[54] IMPEDANCE MATCHING BALUM ARRANGEMENT USING A LOW PASS FILTER

[75] Inventor: Anthony J. Mullett, Exeter, United Kingdom

[73] Assignee: Amulet Electronics Limited, United Kingdom

[21] Appl. No.: 196,080

[22] PCT Filed: Aug. 14, 1992

[86] PCT No.: PCT/GB92/01512

§ 371 Date: Feb. 15, 1994

§ 102(e) Date: Feb. 15, 1994

[87] PCT Pub. No.: WO93/04562

PCT Pub. Date: Mar. 4, 1993

[30] Foreign Application Priority Data

Aug. 15, 1991 [GB] United Kingdom .................. 9117829

[51] Int. Cl.⁶ ..................................................... H03H 7/42
[52] U.S. Cl. ............................................. 333/25; 333/32
[58] Field of Search ......................................... 333/32, 25

[56] References Cited

U.S. PATENT DOCUMENTS

| | | | |
|---|---|---|---|
| 1,866,525 | 7/1932 | Carter | 333/25 X |
| 2,258,107 | 10/1941 | Buschbeck | 333/25 |
| 2,264,718 | 12/1941 | Rust et al. | 333/25 X |
| 3,132,313 | 5/1964 | Alford | 333/32 |

FOREIGN PATENT DOCUMENTS 372213  12/1992  Japan ......................................... 333/25

Primary Examiner—Paul Gensler
Attorney, Agent, or Firm—Ira S. Dorman

[57] ABSTRACT

A balanced line such as 100 ohm UTP is coupled to an unbalanced line or port via a low pass filter enabling color video signals to be passed along the line without degradation. The preferred form of filter is a fifth order Chebychev. An improved performance is achieved by using dissimilar filters at each end of the line.

9 Claims, 4 Drawing Sheets

IMPEDANCE MATCHING BALUM ARRANGEMENT USING A LOW PASS FILTER

TECHNICAL FIELD OF THE INVENTION

This invention relates to impedance matching.

BACKGROUND

The input and output ports of most color video equipment usually, by convention, have a nominal impedance of 75 ohms to match shielded 75 ohm co-axial cable.

Relatively recently there has been a move to standardize voice, data and other communication links on a common form of cable. Some systems currently use a form of cable known as unshielded twisted pair (UTP) while others are attempting to standardize on another form known as shielded twisted pair (STP), but both are essentially balanced lines having an impedance of around 100 ohms. While it is a relatively simple matter, by using suitable matching networks, to pass voice and data signals along such cable for considerable distances without deterioration of the signal, the passage of video signals, and particularly color video signals, has presented an obstacle which hitherto has proved insurmountable.

In order to pass color video signals along, say, UTP cable without degradation, an impedance matching device is required at each end of the cable in order to match the 75 ohm ports or co-axial line to the 100 ohm UTP. This does not present a particular problem in the case of some components of a multi-component video signal, most commonly the red and blue components, since a simple wide band impedance matching transformer can be used with reasonable results. On the other hand, major difficulties have been encountered in matching one component of the color signal (often the green component or, in some systems, a fourth component which carries timing information) because of its extremely wide bandwidth. By way of example, in one commonly used system the green component may include 55 Hz square wave vertical synchronization pulses, 26 KHz horizontal synchronization pulses, and picture information which is centred around 8 MHz and 16 MHz. Other current systems may require an even greater bandwidth, sometimes up to 100 MHz or more. In addition, it may be desirable that the network should allow the passage of d.c. in order, for example, that simple continuity tests can be carried out.

An aim of the present invention may be viewed as being to provide an arrangement which is capable of matching different input and output impedances, can be made to operate over a wide bandwidth (e.g. below 55 Hz to around 120 MHz for a color video signal), and has a low insertion loss.

SUMMARY OF THE INVENTION

The present invention proposes a matching arrangement for color video signals, comprising a balanced line and an unbalanced line or port having a different impedance to the balanced line, in which the two lines or the line and port are coupled via low pass filter means.

Although the common forms of low pass filter usually have unbalanced input and output connections its connection to the balanced line does not appear to have any detrimental effect.

In order to reduce unwanted high frequency signals on the balanced line, which may result in a deterioration in the wanted video signal, the filter is preferably a third or higher order filter. The optimum is a fifth order filter since these have a sharp upper cut-off frequency. On the other hand, increasing the number of filter elements beyond five increases the insertion loss and cost of the matching arrangement with no significant gain in performance.

Whilst the filter will normally be arranged to pass the complete effective bandwidth of the color video signal it will be appreciated that the same effect could be achieved by a combination of a low pass filter with a relatively low cutoff frequency and a bandpass filter arranged to pass the high frequencies of the signal.

There are many basic types of low pass filter which each have their respective advantages and disadvantages, e.g. crystal filters, bridge filters, linear filters and elliptical filters. A preferred form of filter is the kind known as a Chebychev filter. In general, a Chebychev filter comprises a pair of input connections and a pair of output connections with one or more inductances connected in series between a first of the input conections and a first of the output connections, the second input and output connections are connected together and one or more capacitance means are connected between the or each inductance and the common second connections. Such filters can pass signals having both a dc component and an ac component within the designed bandwidth. The dc component passes via the inductances whilst the capacitance means blocks dc from passing between the first and second input and output connections. The or each inductance could also be shunted by further capacitance or inductance means. Examples of such filters are elliptical and bridge filters.

The required filtering and matching characteristics can also be achieved by use of semiconductors (e.g. operational amplifiers) arranged to form so-called active filters. Such filters usually employ a combination of active components (i.e. semiconductors) and passive components (e.g. resistors and capacitors) and are hence known as active RC filters. Whilst such filters can usually be made very small and lightweight and can be produced inexpensively, and tend to suffer less from parasitic effects than passive filters, they suffer from the disadvantages of needing a separate power supply. They also (at the present time) have bandwidth limitations, but they could still be used in some applications, e.g. where a composite video signal is involved.

Returning to passive filters, in the preferred arrangement the or each inductor preferably includes a ferrite core which carries an inductive winding. In order to provide a practical means of adjusting the inductance to achieve a required inductance factor value, the $A_L$ value of the core is preferably lower than 10, where $A_L$ is defined as the inductance of the winding divided by the number of turns squared. The or each capacitance means will usually have a value of between 2.5 pf and 100 pf inclusive. It will be appreciated that although the capacitance means will normally comprise a single capacitor for minimum cost, the same value could be achieved by a combination of capacitors connected in series and/or parallel.

The balanced line may be shielded or unshielded (e.g. STP or UTP).

The low pass filter is preferably included within a housing at the interface between the two lines. The housing will normally be of plastics material so that the physical volume of the housing can be made as small as possible without interfering with the electrical field of the inductances. The housing preferably comprises one part of a plug and socket connector, the other part of the connector being coupled to the balanced line. In the case of a composite video signal, when the red, blue and green components travel along a common pair of conductors, the unbalanced line may enter the housing via a single co-axial lead terminated in a co-axial or BNC connector. The housing would then contain only a single matching network. In another form, the connector includes at least three such matching networks for matching the red, blue and green components (RGB) of a color video signal with the balanced line. Each unbalanced line may enter the housing via a respective co-axial lead which is conveniently terminated in a BNC or other co-axial connector.

In the case of a three component RGB video signal the circuit arrangement of the three filters (one for red, one for green and one for blue) may be incorporated on a single printed circuit board with a common earth plane. This tends to reduce cross-talk between the components. Alternatively, where the signal source and monitor screen at opposite ends of the line are connected to earths of different potentials the three filters are preferably incorporated on three separate boards, or one board with separate earth circuits, in order to reduce hum bars on the monitor screen.

Where the printed circuit board is constructed with separate earth circuits to reduce hum bar problems, the improvement in cross-talk performance at the color pixel frequencies can be maintained by connecting the separate earth circuits through capacitors, the values of which are chosen so as to prevent circulating earth loop currents at mains frequencies (i.e. 50 or 60 Hz), but provide a low impedance path between earth circuits at the color pixel frequencies.

This arrangement of earth-linking capacitors can be extended to improve the performance of video transmission on shielded cable where it is important that the opposite source and screen ends of the cable shield are decoupled from earth. On the other hand, leaving one end of the cable shield floating above earth causes unacceptable degrees of reflection and distortion of the color signal. The use of capacitors between the earth plane of the printed circuit board and the cable shield effectively decouples the shield at frequencies which include mains power and most data transmissions but allows better performance at the higher pixel frequencies.

BRIEF DESCRIPTION OF THE DRAWINGS

The invention will now be described by way of example with reference to the accompanying drawings, in which.

DETAILED DESCRIPTION OF THE DRAWINGS

Figure 1:
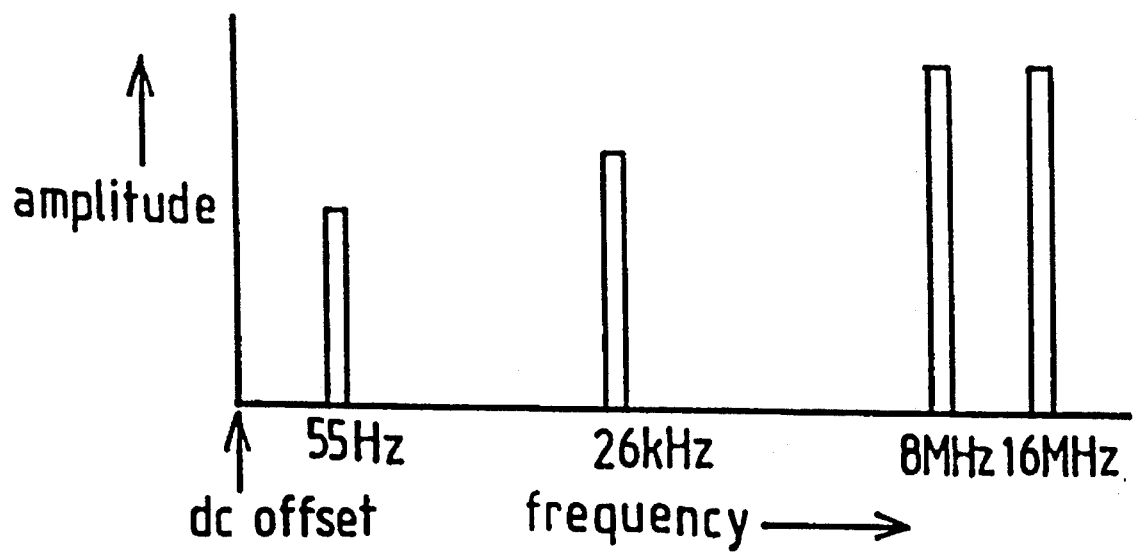
FIG. 1 is a graphic illustration of the green component of a color video signal, with signal strength on the y axis plotted against frequency on the x axis.

By way of example, FIG. 1 shows diagrammatically the frequency spectrum of a typical green component of a three component color video signal. The main components of the green signal include 55 KHz square wave frame sync. pulses, 26 KHz square wave line sync. pulses, and the pixel information at 8 and 16 MHz.

In order to pass such a signal from standard 75 ohm unbalanced co-axial cable to 100 ohm UTP (or vice versa) a suitable matching network must be capable of meeting the following requirements:

1. To provide an impedance transformation of 75: 100 ohms.
2. To pass dc (e.g. for testing purposes).
3. To pass ac signals from below 55 Hz to about 100 MHz.
4. The shape of the square wave timing (sync.) pulses should be maintained.
5. There must be minimal attenuation of the signal (i.e. low insertion loss).
6. The network must not resonate at any of the signal or timing frequencies.

Figure 2:
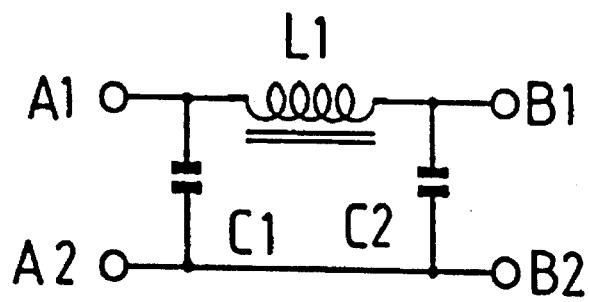
FIGS. 2 to 9 are circuit diagrams of suitable low pass filters for use in matching arrangements of the invention.

A third order chebyshev matching network which meets the above requirements is shown in FIG. 2. The network has a pair of high impedance connections A1 and A2 and a pair of lower impedance connections B1 and B2. The first high impedance connection A1 is connected to one end of an inductance L1 which is wound on a suitable ferrite core. The other end of the inductance is connected to the first low impedance connection B1. In addition, the high impedance connections A1 and A2 are shunted by a first capacitor C1 and the low impedance connections B1 and B2 are shunted by a second capacitor C2. Such a filter is commonly known as a pi network. The filter acts to pass signal frequencies from dc to a designed cut-off frequency. The filter has no resonances which could cause problems.

Figure 3:
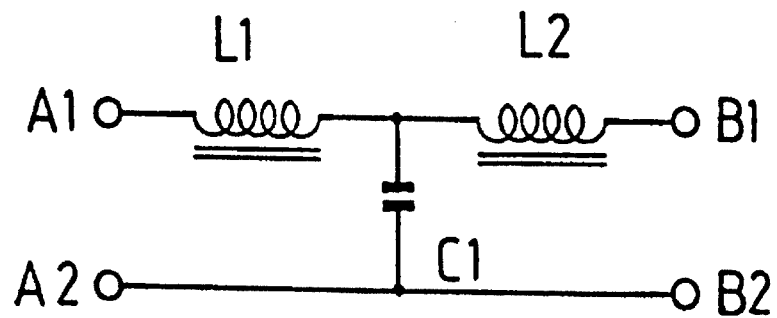

A second form of third order chebyshev filter which could be used is shown in FIG. 3. Here two inductors L1 and L2 are connected bewtween the first high and low impedance connections A1 and B1 and a capacitor C1 is connected from the junction of the two inductors to the second high and low impedance connections A2 and B2.

Figure 4:
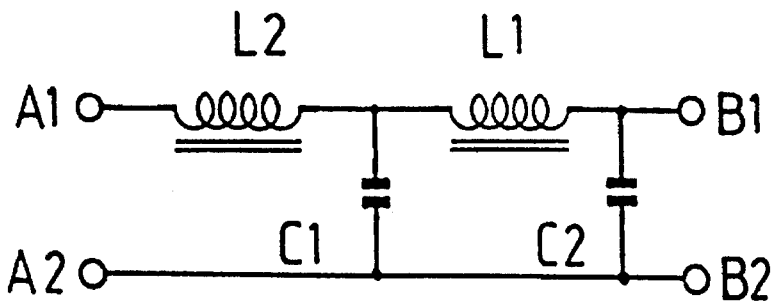
Figure 5:
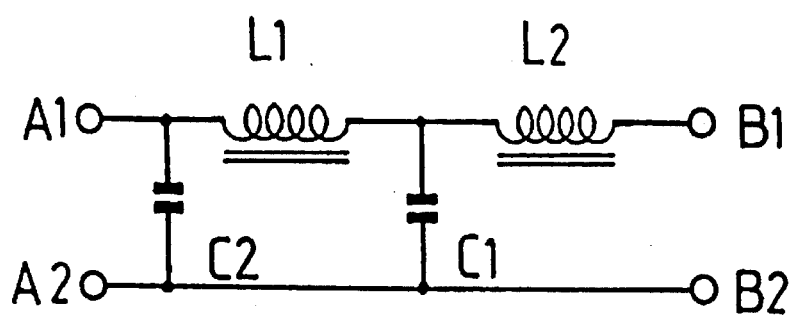
Figure 6:
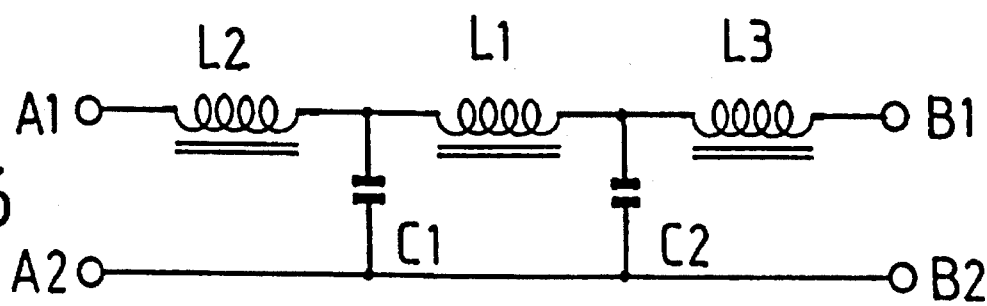

A fourth order low pass filter can be constructed by inserting a further inductor L2 between the first input or output connections A1 or B1 of FIG. 2 and the first inductor L1 (see FIGS. 4 and 5). By including inductors L2 and L3 in both of these positions a fifth order filter is produced (see FIG. 6). Another form of fifth order filter (FIG. 7) is produced by adding a further capacitor C3 across the high or low impedance connections in FIGS. 4 or 5.

Figure 7:
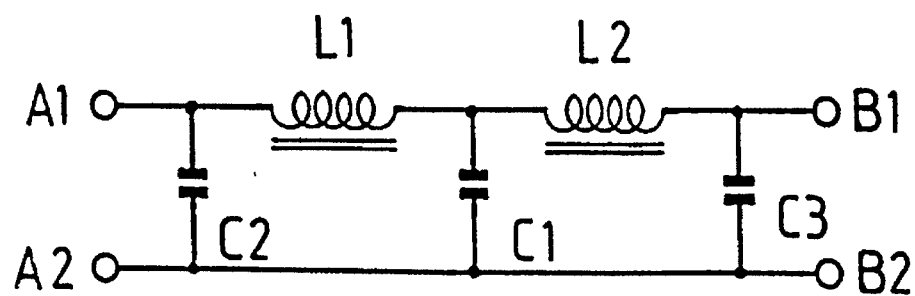
Figure 8:
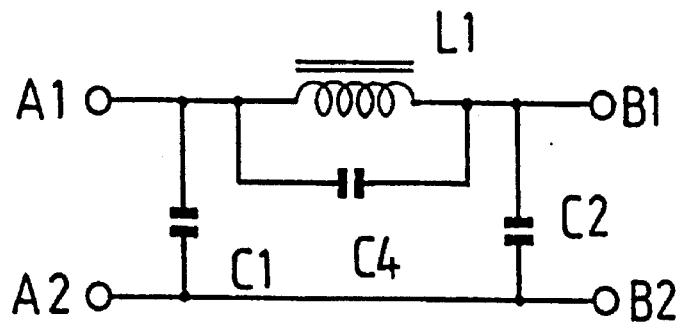
Figure 9:
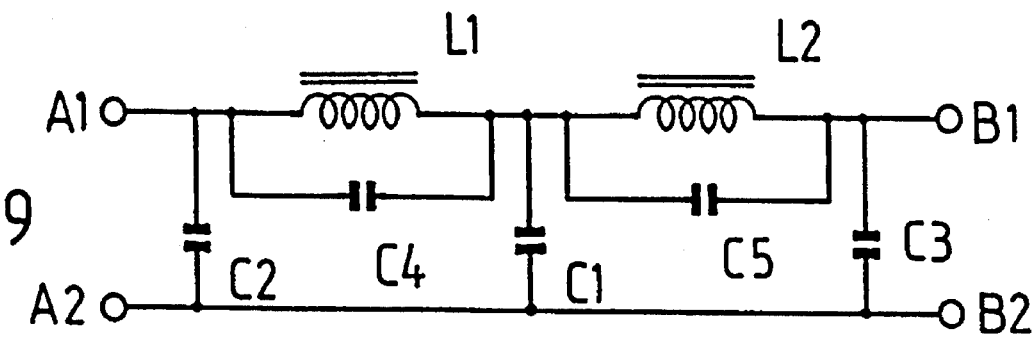

The filters of FIGS. 2 and 7 can be modified by shunting the inductors by further capacitors C4 and C5, as shown in FIGS. 8 and 9. This produces a form of low pass filter known as an elliptical filter. Although this form of filter can be used it has a tendency to "ring" or resonate, which is generally to be avoided.

It will thus be noted that in each form of filter dc can pass between the input and output connections via the inductor or inductors without being shunted.

The necessary impedance transformation is obtained by suitable choice of the inductor and capacitor values. The impedance match is important for the effective working of such a filter since a good match will both reduce signal reflections and hence picture distortion, and maximize the transfer of signal power thereby increasing the distance over which the video signal can be effectively transmitted. The design procedure for producing filters with the required characteristics is well documented, e.g. "Filter Handbook—A Practical Design Guide" by Stefan Nienaidowski, Hinemann 1989, and "Handbook of Filter Synthesis" by Anatoly Zverev, John Wiley & Sons. Briefly, the design process involves, firstly, deciding upon the required bandwidth. A set of calculations are then used to produce reference or normalized values of inductance or capacitance.

Depending upon the matching ratio required, (e.g. 0.75 for 75 ohm to 100 ohm), and the order of filter chosen, published tables are then consulted to provide the required combination of inductance and capacitance.

Figure 12:
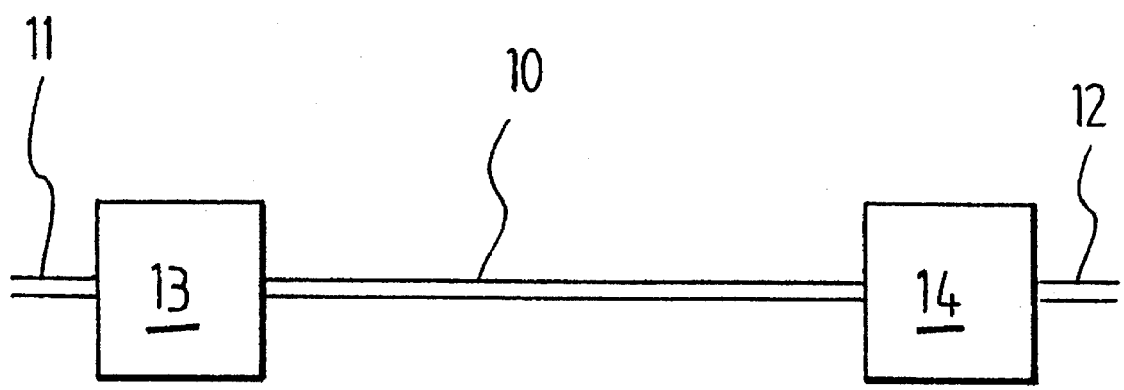
FIG. 12 is a block diagram showing two matching arrangements of the invention, coupled by a balanced line.

A variable resistor can be connected between one of the first connections A1 or B1 and the filter to introduce a variable resistance. A voltage dependent resistor may also be connected across the high impedance connections A1 and A2, or across the low impedance Connections B1 and B2, for line protection. As shown in FIG. 12, a balanced line 10 can be coupled at each end to respective unbalanced lines 11 and 12 via respective low pass filters 13 and 14.

Figure 10:
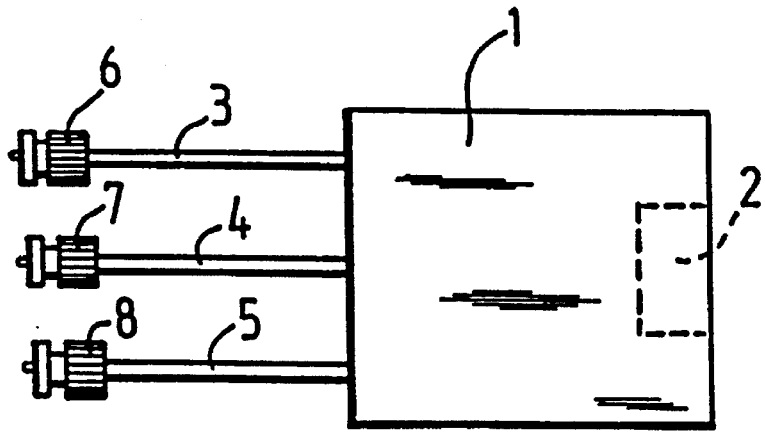
FIGS. 10 and 11 are plan and end views respectively of a connector incorporating three such matching arrangements.
Figure 11:
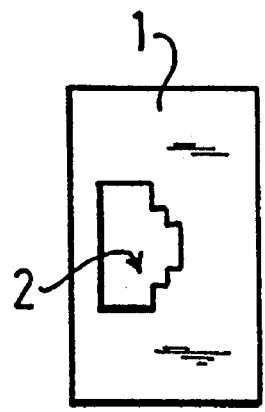

The filter can be incorporated into a connector within a molded plastic housing at the interface between 75 ohm cable and 100 ohm UTP. The high impedance connections A1 and A2 are connected to the UTP whilst the low impedance connections B1 and B2 are connected to the 75 ohm cable. A suitable form of connector is shown in FIGS. 10 and 11. The connector includes a molded plastic housing 1 which incorporates, at one end of the housing, an eight way modular jack socket 2 for receiving an eight pin plug connected to one end of the UTP. The connector incorporates three (or more) such filters for matching the three color signals, red, blue and green, to the UTP. The color signals pass via three (or more) co-axial flying leads 3, 4 and 5 which pass through the housing at the opposite end to the socket 2 and terminate in co-axial BNC connectors 6, 7 and 8.

A similar filter can be used to pass red, green and blue signals which are transmitted as a composite signal (e.g. from a video camera) when only one filter circuit may be necessary.

It will be appreciated that the housing could incorporate a plug connector in place of the socket 2, the UTP being coupled instead to a socket-type connector.

Normally, the arrangement will be duplicated at each end of the UTP. In some circumstances, because of the different characteristics of filters of different bandwidths, it is advantageous to arrange for filters of different bandwidths to work in pairs, conveniently at each end of the video cable. The peaks and troughs in the signal return loss characteristic of such filters can be arranged to produce a cancellation effect which improves the overall signal return loss and hence improves the matching ability of the filter pair.

By way of illustration, using fifth order Chebychev filters it has proved possible to pass high quality three-component RGB video signals along high frequency data cable (e.g. UTP) for up to 250 m or more. Even with standard "twisted pair" cables (e.g. conventional telephone line) good quality pictures can be sent for at least 50 m. Composite color video signals can similarly be sent down ordinary data cables for considerable distances without degradation. By using filters of dissimilar bandwidths at each end of the cable the signal return losses can typically be improved from around −16 dB to −22 dB.

In some cases it may be convenient to pass a d.c. supply through the connector, e.g. when coupling a keyboard to a computer terminal along the same wiring route. In such cases it may be advantageous to use active filters in place of the passive filters. The design principles for active filters are different from passive filters, but are readily available. (e.g. tenth Sagara colloquium on "Digital and Analogue Filters and Filtering Systems" by Peter Saul, published by The Institution of Electrical Engineers, Savoy Place, London, May 1990.)

I claim:

1. A matching arrangement comprising a balanced line, an unbalanced connecting element having a different impedance from said balanced line, and low pass filter means coupled between said balanced line and said unbalanced element; characterised in that; (1) there is no transformer between said balanced line and said unbalanced element; (2) the impedances of said balanced line and said unbalanced element are matched by said low pass filter means; (3) said filter means comprises a pair of input connections and a pair of output connections with at least one inductance means connected between a first of said input connections and a first of said output connections, the second input and output connections are connected together in common, and at least one capacitance means is connected between said at least one inductance means and the common second connections, with said filter means comprising at least two of either (a) said inductance means, connected in series with said capacitance means connected therebetween, and (b) said capacitance means, connected in parallel with said inductance means connected therebetween; and (4) said inductance means includes a ferrite core having an inductance factor value less than 10 and carrying an inductive winding, and said capacitance means having a value of between 2.5 pf and 100 pf, inclusive, said low pass filter means being included within a plastics housing at the interface between two lines, and said housing comprising one part of a plug and socket connector, the other part of the connector being coupled to the balanced line.

2. A matching arrangement according to claim 1, in which said unbalanced line enters the housing via a co-axial lead.

3. A matching arrangement according to claim 2, in which said co-axial lead is terminated in a co-axial connector.

4. A matching arrangement comprising a balanced line, an unbalanced connecting element having a different impedance from said balanced line, and low pass filter means coupled between said balanced line and said unbalanced element; characterized in that; (1) there is no transformer between said balanced line and said unbalanced element; (2) the impedances of said balanced line and said unbalanced element are matched by said low pass filter means; (3) said filter means comprises a pair of input connections and a pair of output connections with at least one inductance means connected between a first of said input connections and a first of said output connections, the second input and output connections are connected together in common, and at least one capacitance means is connected between said at least one inductance means and the common second connections, with said filter means comprising at least two of either (a) said inductance means, connected in series with said capacitance means connected therebetween, and (b) said capacitance means, connected in parallel with said inductance means connected therebetween; and (4) said inductance means includes a ferrite core having an inductance factor value less than 10 and carrying an inductive winding, and said capacitance means having a value of between 2.5 pf ad 100 pf, inclusive; said low pass filter means being included within a plastics housing at the interface between two lines, and said housing including at least three such matching arrangements for respectively matching the red, blue and green components of a color video signal with the balanced line.

5. A matching arrangement comprising a balanced line, an unbalanced connecting element having a different impedance from said balanced line, and low pass filter means coupled between said balanced line and said unbalanced element; characterized in that; (1) there is no transformer between said balanced line and said unbalanced element; (2) the impedances of said balanced line and said unbalanced element are matched by said low pass filter means; (3) said filter means comprises a pair of input connections and a pair of output connections with at least one inductance means connected between a first of said input connections and a first of said output connections, the second input and output connections are connected together in common, and at least one capacitance means is connected between said at least one inductance means and the common second connections, with said filter means comprising at least two of either (a) said inductance means, connected in series with said capacitance means connected therebetween, and (b) said capacitance means, connected in parallel with said inductance means connected therebetween; and (4) said inductance means includes a ferrite core having an inductance factor value less than 10 and carrying an inductive winding, and said capacitance means having a value of between 2.5 pf and 100 pf, inclusive, the balanced line being coupled at each end to a respective unbalanced line via respective low pass filter means.

6. A matching arrangement according to claim 5, in which the filter means comprises a third or higher order filter.

7. A matching arrangement according to claim 6, in which the filter is a fifth order filter.

8. A matching arrangement according to claim 5, in which said balanced line is selected from the class consisting of shielded and unshielded twisted pair lines.

9. A matching arrangement according to claim 5, in which dissimilar low pass filter means are used at opposite ends of the balanced line.

* * * * *